(12) United States Patent
Higashide

(10) Patent No.: US 6,222,758 B1
(45) Date of Patent: Apr. 24, 2001

(54) SEMICONDUCTOR MEMORY DEVICE HAVING AT LEAST TWO LAYERS OF BIT LINES

(75) Inventor: Yoshiko Higashide, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/571,023

(22) Filed: May 15, 2000

(30) Foreign Application Priority Data

Dec. 7, 1999 (JP) .................................................. 11-347449

(51) Int. Cl.[7] .................................................. G11C 11/00
(52) U.S. Cl. ............................................. 365/154; 257/903
(58) Field of Search ................................ 365/154, 129; 257/903

(56) References Cited

U.S. PATENT DOCUMENTS

| 5,280,441 | 1/1994 | Wada et al. . |
| 5,379,248 | 1/1995 | Wada et al. . |
| 5,563,820 | 10/1996 | Wada et al. . |
| 5,699,308 | 12/1997 | Wada et al. . |
| 5,944,597 | * 6/2000 | Honda .................................. 257/369 |
| 6,072,714 | * 6/2000 | Deguchi .............................. 365/154 |

FOREIGN PATENT DOCUMENTS

| 4-228188 | 8/1992 | (JP) . |
| 6-259968 | 9/1994 | (JP) . |
| 7-183396 | 7/1995 | (JP) . |
| 8-255484 | 10/1996 | (JP) . |

* cited by examiner

Primary Examiner—David Nelms
Assistant Examiner—Hoai V. Ho
(74) Attorney, Agent, or Firm—McDermott, Will & Emery

(57) ABSTRACT

In the semiconductor memory device, the size in the row direction of the memory cell region having no through-hole therein is made smaller than that of the memory cell region having a through-hole therein. Thus, even if the semiconductor memory device has a double-layered bit line configuration and the size in the row direction of the memory cell region increases due to the through-hole connecting the bit lines in the first and second layers or the like, it is possible to prevent the increase in size of the memory cell region, and hence, the increase in area of the memory cell array.

12 Claims, 15 Drawing Sheets

SEMICONDUCTOR MEMORY DEVICE HAVING AT LEAST TWO LAYERS OF BIT LINES

BACKGROUND OF THE INVENTION

1. Field of the Invention

The present invention relates to a semiconductor memory device having at least two layers of bit lines.

2. Description of the Background Art

In recent years, a T-shaped bit line configuration formed of at least two layers of bit lines has been employed in semiconductor memory devices, especially in static random access memories (SRAM). Such a configuration is disclosed, for example, in Japanese Patents Laying-Open Nos. 4-228188 and 7-183396.

FIG. 11 shows configurations of a memory cell array and its peripheral circuits of a semiconductor memory device, which is essentially identical to FIG. 13 of Japanese Patent Laying-Open No. 7-183396.

Referring to FIG. 11, memory cells 1a–1c are partitioned by a broken line. Note that this line is only shown in the drawing for convenience, and there is no such partition in an actual product. FIG. 11 includes squares other than memory cells 1a–1c. These squares, identical to memory cells 1a–1c but having no reference characters, also show memory cells. Likewise, for other patterns representing various components through the drawings, those having the same shapes represent the same components, and only representative members are labeled for purposes of presentation.

Bit lines in the first layer (hereinafter, first-layer bit lines) 2a and 2b are connected to the same memory cell, forming a bit line pair. Both bit lines 2a and 2b are also connected to bit line peripheral circuits 4a and 4c.

A word line 3 is connected to memory cells 1a, 1c, . . . , and to a row decoder 5. Of the bit lines in the second layer (hereinafter, second-layer bit lines) 22a and 22b, bit line 22a is connected via a contact hole 12a to first-layer bit line 2a, and bit line 22b is connected via a contact hole 12b to first-layer bit line 2b. Both bit lines 22a and 22b are connected to a bit line peripheral circuit 4b.

Generally, the direction along which first-layer bit lines 2a, 2b extend is called a column direction, while the direction along which word line 3 extends is called a row direction. Memory cells are arranged in the row and column directions, forming a memory cell array.

FIG. 12 shows memory cells within the memory cell array corresponding to a region A of FIG. 11, with three memory cells in the row direction and two memory cells in the column direction being selected. FIG. 12 illustrates the pattern of the bit lines in the first and second layers.

Memory cell regions 31a–31c include first-layer bit lines 32a–32d formed of a first metal interconnection layer, and second-layer bit lines 52a, 52b formed of a second metal interconnection layer. Second-layer bit lines 52a, 52b are connected via through-holes 42a, 42b as contact holes, to firstlayer bit lines 32a, 32b, respectively. Through-holes 42a and 42b are provided in respective memory cell regions 31a and 31b.

FIG. 13 illustrates an example of a memory cell pattern commonly used in an SRAM. Specifically, FIG. 13 shows the memory cell pattern located underneath the first-layer bit lines, corresponding to memory cell region 31a of FIG. 12.

This memory cell pattern includes: separating insulation films 61a–61c; active layers 62a–62j; layers including polycrystalline silicon (hereinafter, referred to as "polysilicon layers") 63a–63c; third metal interconnection layers 65a–65d; and first contacts 64a–64d coupling active layers 62a–62j and third metal interconnection layers 65a–65d.

Here, metal interconnection layer 65a is a GND interconnection, and metal interconnection layer 65b is a Vcc interconnection. First contacts 64a, 64b are called GND contacts, and first contacts 64c, 64d are called Vcc contacts. Further, this memory cell pattern includes: a first contact 64e connecting the polysilicon layer and the third metal interconnection layer; and second contacts 66a, 66b connecting first-layer bit lines 32a, 32b and active layers 62a, 62b, respectively. Second contacts 66a, 66b are herein called bit line contacts.

Active layers 62b, 62e, 62g and 62i are the layers storing memory data of the memory cell. Active layers 62b and 62g are connected by third metal interconnection layer 65c, thereby forming one storage node portion. Active layers 62e and 62i are connected by third metal interconnection layer 65d, thereby forming the other storage node portion.

Active layers 62c, 62f are the layers connected via GND contacts 64a, 64b to GND interconnection 65a. Thus, they are called the GND active layers. Active layers 62h, 62j are connected via Vcc contacts 64c, 64d to Vcc interconnection 65b, and thus called the Vcc active layers. Polysilicon layer 63a corresponds to word line 3 of FIG. 11.

Generally, memory cell regions have no boundary therebetween in an actual semiconductor memory device, and therefore, various definitions of boundaries can be considered. In any case, a memory cell region is a region which normally stores data of one bit.

Here, the size of the memory cell region in the row direction is defined as a minimal distance between the contact centers of GND contacts 64a and 64b taken in the row direction. It is specifically shown as CO in FIG. 13. The size of the memory cell region in the column direction is defined as a minimal distance between the contact center of bit line contact 66a or 66b and the center line of Vcc interconnection 65b.

In the case of FIG. 12, the size of the memory cell region in the row direction can be defined as the distance from the midpoint of bit lines 32a and 32c to the midpoint of bit lines 32b and 32d.

In the conventional memory cells as shown in FIGS. 12 and 13, the size of the memory cell region in the row direction is normally limited by the size of the pattern underneath the first-layer bit lines.

However, if the miniaturization of the pattern underneath the first-layer bit lines advances beyond the miniaturization of the pattern of the metal interconnection layers, it is expected that the size of the memory cell region will be limited by the size of the first-layer bit lines.

In particular, in memories required to operate with even higher speed or system LSI devices incorporating logic and memories in the coming age, the double layered bit line configurations will be widely used. Thus, there is a high possibility that the bit lines in the first and second layers may limit the memory cell size.

Specifically, the size of the memory cell in the row direction may be affected or limited by the size of the portion connecting the bit lines in the first and second layers. FIGS. 14 and 15 illustrate possible examples thereof.

To explain the limitation as described above in more detail, assume that the boundary of the memory cell regions in the row direction is defined as follows.

For the first memory cell and the second memory cell adjacent to each other in the row direction, their boundary is a line which passes the midpoint of the minimal gap between edges of a first-layer bit line in the first memory cell and a first-layer bit line in the second memory cell, and extends parallel to the column direction of the memory cell array.

Specifically, with reference to FIG. 14, the boundary on the left side is a line passing the midpoint between the edge of the projected portion of first-layer bit line 32a and the edge of first-layer bit line 32c, and extending parallel to first-layer bit line 32c. The boundary on the right side is a line passing the midpoint between the edge of the projected portion of first-layer bit line 32b and the edge of first-layer bit line 32d, and extending parallel to first-layer bit line 32d.

With the assumption as described above, the size in the row direction of the memory cell region of FIG. 14 will now be considered. Referring to FIG. 14, if S is a distance between the edges of the first-layer bit lines; M is a margin for the through-hole and the first-layer bit line; X is the size of the through-hole in the row direction; and W is the line width of the first-layer bit lines, then the size C1 of the memory cell region in the row direction can be expressed as follows:

$$C1=2S+3M+X+W$$

if $2M+X \geq W$.

In FIG. 14, the pattern of the first-layer bit lines includes a portion projecting from both sides beyond the bit line width, around the region in which a through-hole is being disposed. FIG. 15 illustrates the pattern in the case where such projection is allowed only to one side.

With reference to FIG. 15, the boundary on the left side is a line passing the midpoint between the edges of first-layer bit lines 32e and 32c, and extending parallel to first-layer bit line 32c. The boundary on the light side is a line passing the midpoint between the edges of first-layer bit lines 32f and 32d, and extending parallel to first-layer bit line 32d.

In this case, the size C2 of the memory cell region in the row direction when $2M+X \geq W$ becomes as follows:

$$C2=2S+2M+X+W$$

The configuration shown in FIG. 15 enables the size of the memory cell region in the row direction to be decreased by M with respect to the configuration shown in FIG. 14.

As explained above, in FIGS. 14 and 15, the size of the memory cell in the row direction is limited by the size of the first-layer bit lines. If the size C1 or C2 of the memory cell region in the row direction is affected by the margin M for the through-hole and first-layer bit lines and the size X of the through-hole in the row direction, and thus exceeds the size C0 of the memory cell region in the row direction that is limited by the pattern underneath the first-layer bit lines, then it will become necessary to considerably increase the area of the memory cell array to ensure the size C1 or C2 in the row direction for every memory cell region.

SUMMARY OF THE INVENTION

An object of the present invention is to provide a semiconductor memory device which can suppress an increase in area of the memory cell array even when the size of the memory cell in the row direction is affected by the connecting portions of the bit lines in the first and second layers and it exceeds the size of the memory cell region in the row direction limited by the pattern underneath the first-layer bit lines.

The semiconductor memory device according to a first aspect of the present invention includes: a memory cell array having a plurality of memory cells arranged in row and column directions; a first-layer bit line passing a memory cell region having the memory cell formed therein and extending in the column direction of the memory cell array; and a second-layer bit line connected to the first-layer bit line via a contact hole. The memory cell array includes a memory cell region having the contact hole disposed therein and a memory cell region having no contact hole therein. The memory cell region without the contact hole has a length in the row direction that is shorter than the length in the row direction of the memory cell region with the contact hole.

In the semiconductor memory device according to a second aspect of the present invention, the first memory cell region with the contact hole is prevented from being placed adjacent to the second memory cell region without the contact hole having a shorter length in the row direction.

In the semiconductor memory device according to a third aspect of the present invention, the first memory cell region with the contact hole is prevented from being placed, only in the row direction, adjacent to the second memory cell region without the contact hole having a shorter length in the row direction.

In the semiconductor memory device according to a fourth aspect of the present invention, the first memory cell region with the contact hole is prevented from being placed, only in the column direction, adjacent to the second memory cell region without the contact hole having a shorter length in the row direction.

In the semiconductor memory device according to a fifth aspect of the present invention, only the first memory cell region with the contact hole has a longer length in the row direction.

In the semiconductor memory device according to a sixth aspect of the present invention, the length in the row direction of the second memory cell region without the contact hole that is placed adjacent in the column direction to the first memory cell region with the contact hole is the same as the length in the row direction of the first memory cell region.

In the semiconductor memory device according to a seventh aspect of the present invention, the memory cell region has first and second storage node portions. A first active layer is formed in the first storage node portion and a second active layer is formed in the second storage node portion. The first and second active layers are spaced apart from each other by a separating insulation film. The separating insulation film in the second memory cell region without the contact hole is narrower than the separating insulation film in the first memory cell region with the contact hole.

In the semiconductor memory device according to an eighth aspect of the present invention, the memory cell region includes a GND interconnection or a Vcc interconnection, and an active layer connected to the GND interconnection or an active layer connected to the Vcc interconnection. The GND or Vcc active layer in the second memory cell region without the contact hole is narrower in the row direction than the GND or Vcc active layer in the first memory cell region with the contact hole.

In the semiconductor memory device according to a ninth aspect of the present invention, the second-layer bit line includes first and second bit lines, and an interconnection layer, formed in the same step as the first and second bit lines, is placed between the first and second bit lines.

In the semiconductor memory device according to a tenth aspect of the present invention, the second-layer bit line includes first and second bit lines, and the first-layer bit line includes third and fourth bit lines. The first bit line and the third bit line are connected to each other via a first contact hole. The second bit line and the fourth bit line are connected to each other via a second contact hole. The first and second contact holes are placed in one memory cell region.

In the semiconductor memory device according to an eleventh aspect of the present invention, the first-layer bit line is formed in an upper layer than the second-layer bit line.

In the semiconductor memory device according to a twelfth aspect of the present invention, the memory cell regions with the contact holes are prevented from being placed adjacent to each other.

The present invention configured as described above exhibits the following effects.

According to the first aspect, the size in the row direction of the memory cell region without the through-hole is made shorter than that of the memory cell region with the through-hole. This restricts the increase in area of the memory cell array.

According to the second to fourth and sixth aspects, the size in the row direction of the memory cell region that is adjacent to the memory cell region with the through-hole is increased. This simplifies the formation of the memory pattern.

According to the fifth aspect, only the memory cell region with the through-hole is elongated in the row direction. This further restricts the increase in area of the memory cell array.

According to the seventh aspect, the width of the separating insulation film between the storage node portions is increased in the memory cell region with the through-hole. This simplifies the formation of the memory cell pattern.

According to the eighth aspect, the width of the active layer connected to the GND or Vcc interconnection is increased in the memory cell region with the through-hole. This also simplifies the formation of the memory cell pattern.

According to the ninth aspect, the interconnection layer, formed in the same step as the second-layer bit lines, is placed between the second-layer bit lines. This suppresses the noise between the bit lines.

According to the tenth aspect, a plurality of through-holes is place in one memory cell region. This reduces the number of memory cells having the through-holes and thus longer in the row direction.

According to the eleventh aspect, the first-layer bit line is formed in an upper layer than the second-layer bit line. This restricts bit line resistance in the case where the first-layer bit line is longer.

According to the twelfth aspect, the memory cell regions with through-holes are prevented from being placed adjacent to each other. This suppresses noise between the bit lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
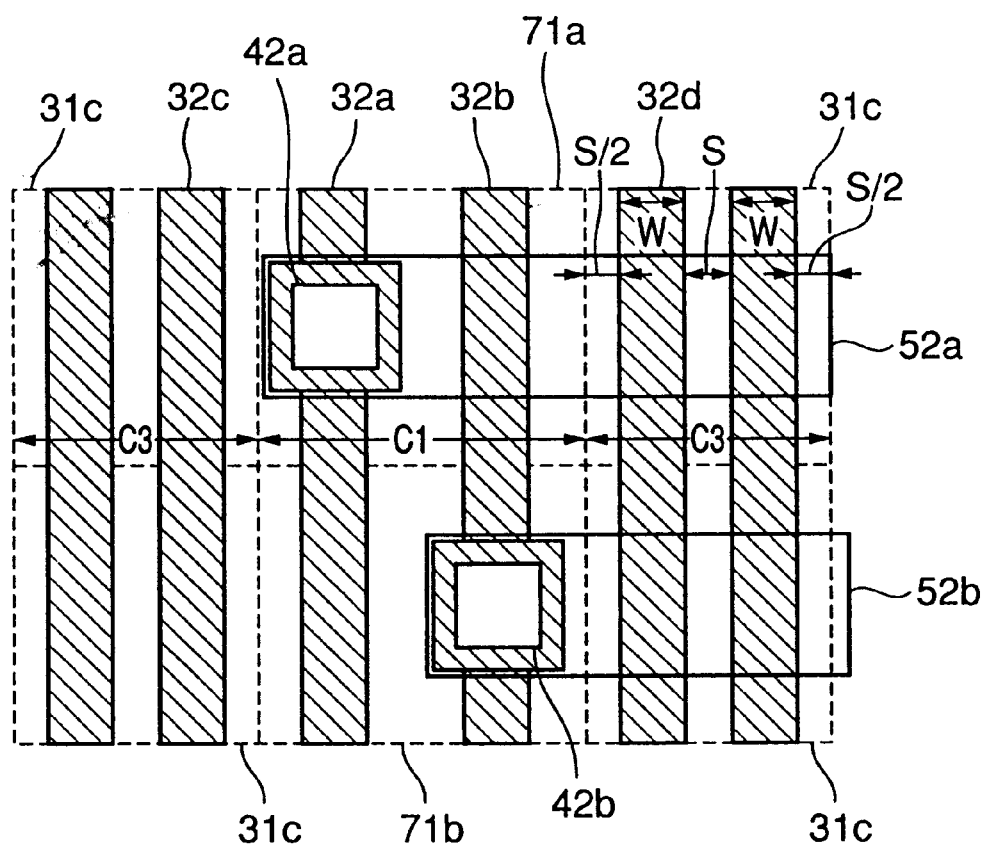
FIG. 1 shows a pattern of a memory cell array according to a first embodiment of the present invention.

FIG. 1 shows a portion of a memory cell array according to the first embodiment of the present invention, with three memory cells in the row direction and two memory cells in the column direction being selected. Specifically, it shows the memory cell pattern associated with first-layer and second-layer bit lines.

This memory cell pattern includes: memory cell regions 31c, 71a and 71b; first-layer bit lines 32a–32d formed of the first metal interconnection layer; and second-layer bit lines 52a, 52b formed of the second metal interconnection layer. Second-layer bit lines 52a and 52b are connected via through-holes 42a and 42b to first-layer bit lines 32a and 32b, respectively. Memory cell regions 71a and 71b include through-holes 42a and 42b.

The definition of the boundary of the memory cell regions in the row direction is the same as in the conventional one. Specifically, the boundary of the first and second memory cells adjacent to each other in the row direction is defined as a line passing the midpoint of the minimal gap between the opposing edges of the first-layer bit lines in the first and second memory cells, and extending parallel to the column direction of the memory cell array.

Further, the size of the memory cell region in the row direction is defined as the minimal distance between the boundaries on left and right sides thereof.

These definitions apply to any embodiments, if not explicitly stated.

With the definitions as described above, the boundaries in the row direction of memory cell region 71a in FIG. 1 are defined as follows. The boundary on the left side is a line passing the midpoint between the edge of the projection of first-layer bit line 32a and the edge of first-layer bit line 32c and extending parallel to first-layer bit line 32c. The boundary on the right side is a line passing the midpoint between the edge of the projection of first-layer bit line 32b and the edge of first-layer bit line 32d and extending parallel to first-layer bit line 32d.

According to the present embodiment, the size in the row direction of memory cell regions 31c having no through-holes therein becomes smaller than that of memory cell regions 71a, 71b having through-holes therein. Comparing FIG. 1 with FIG. 14, all the memory cell regions in the conventional case of FIG. 14 have the same size Cl in the row direction, whereas, in the present embodiment, the memory cell regions with the through-holes have the size C1, and those without the through-holes have the size C3.

Now, the size in the row direction of the memory cell regions of the present embodiment will be specifically described using expressions.

Figure 14:
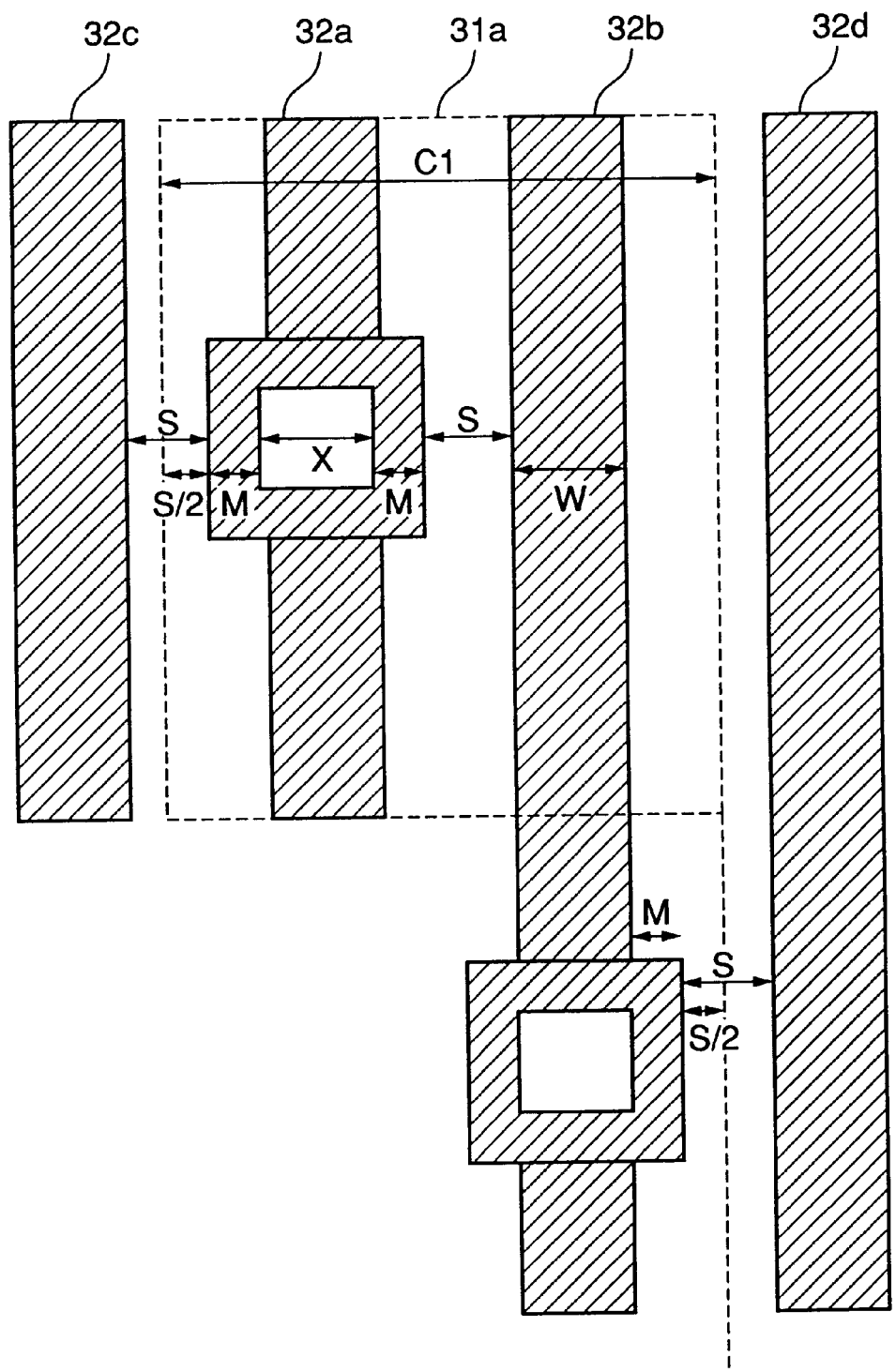

As in FIG. 14, if S is the gap between the edges of the first-layer bit lines, M is a margin for the through-hole and the first-layer bit line; X is the size of the through-hole in the row direction; and W is the line width of the first-layer bit line, then memory cell region 31c having no throughholes therein as shown at the upper right corner of FIG. 1 has the size C3 in the row direction that can be expressed as follows:

$$C3 \geq 2S+2W$$

Here, in the above expression, the symbol "$\geq$" is used instead of "=", because the size in the row direction of the memory cell region having no through-holes therein may be limited by the size of the pattern underneath the first-layer bit lines in some cases.

The size C1 can be expressed as follows, as explained in conjunction with FIG. 14:

$$C1=2S+3M+X+W$$

if $2M+X \geq W$.

Combining the above expressions, we have:

$$2S+2W \leq C3 \leq 2S+3M+X+W=C1.$$

In practice, however, the devices may not be finished exactly as designed. Thus, the symbol "=" in the above expressions means that the both sides are not absolutely equal to each other, but substantially equal to each other. This also applies to the equations below.

Thus, according to the present embodiment, it is possible to restrict the increase in area of memory cell array even when the size in the row direction of the memory cell regions having through-holes therein exceeds the size in the row direction of the memory cell regions that is limited by the pattern underneath the first-layer bit lines.

In other words, according to the present embodiment, only some of the memory cell regions require enlarged areas. Thus, the increase in area of the memory cell array as a whole is restricted.

Second Embodiment

Figure 13:
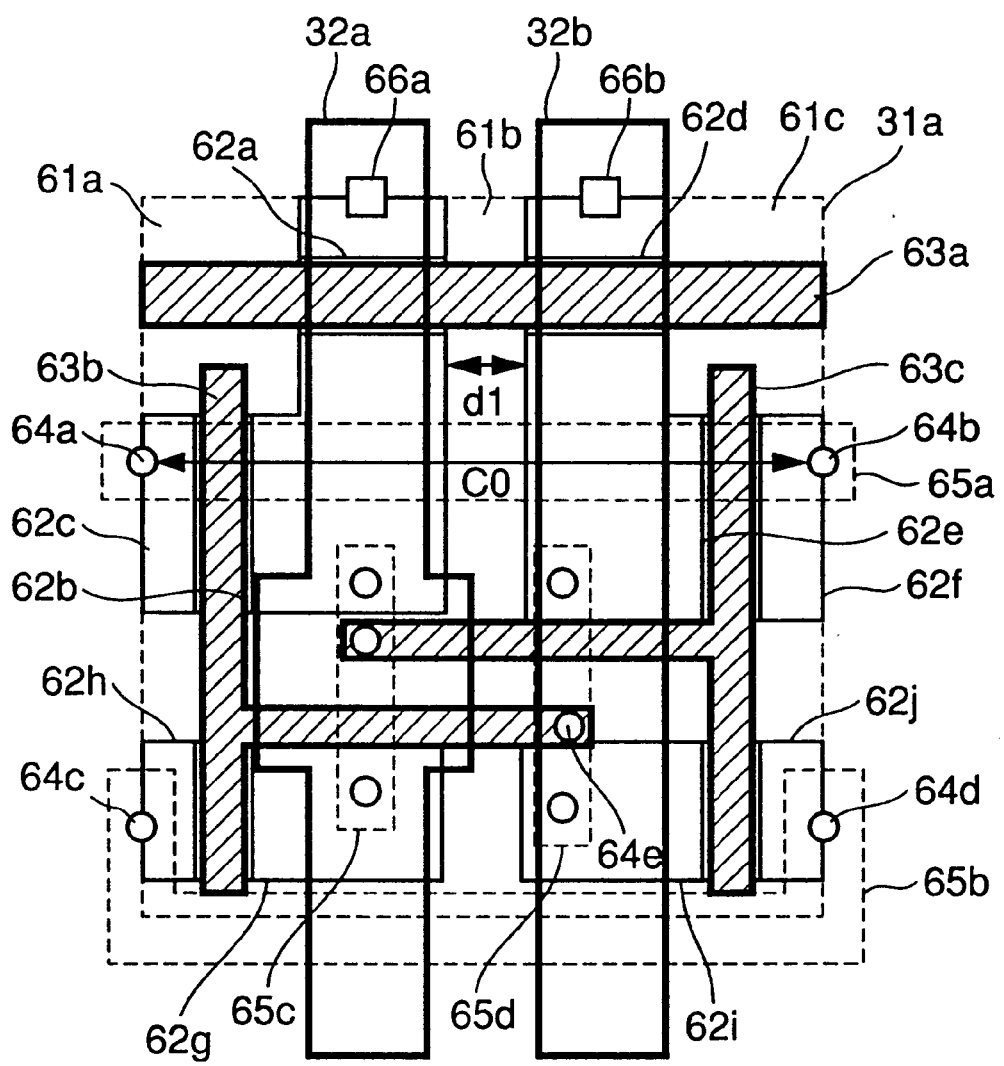
FIGS. 13 to 15 show first to third patterns of the conventional memory cell regions.

For the memory cell region having no through-hole therein, the memory cell pattern underneath the first-layer bit lines can be identical to the conventional one as shown in FIG. 13. However, for the memory cell region having the through-hole therein, e.g., memory cell region 71a of FIG. 1, the memory cell pattern underneath the first-layer bit lines should be different from the conventional one, because the size in the row direction of the memory cell region is increased.

One way to achieve such an enlarged memory cell pattern is to simply extend the conventional pattern, as shown in FIG. 13, in the row direction. However, this may cause a problem with the electrical properties or the like. Thus, a memory cell pattern is shown in FIG. 2 as the second embodiment.

Figure 2:
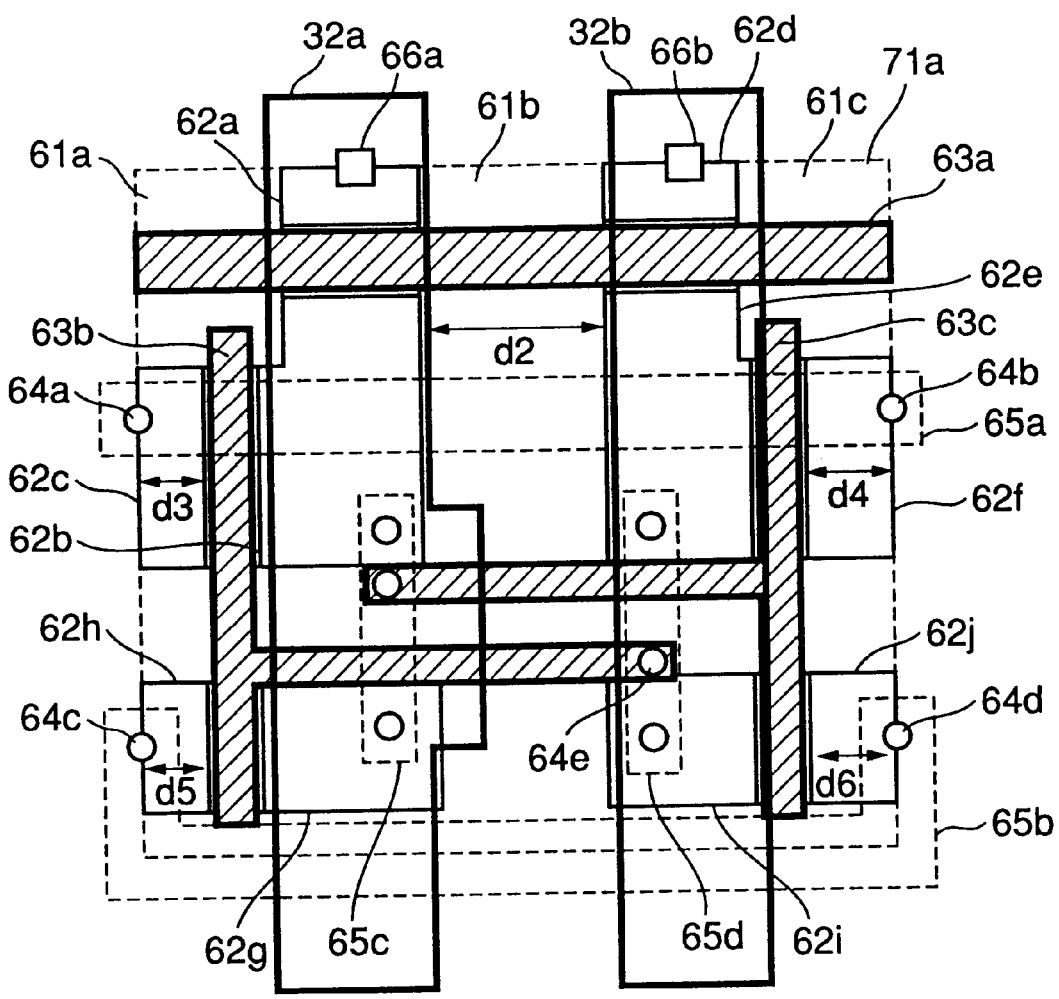
FIG. 2 shows a pattern of a memory cell region according to a second embodiment of the present invention.

With reference to FIG. 2, the memory cell pattern includes: separating insulation films 61a–61c; active layers 62a–62j; polysilicon layers 63a–63c; third metal interconnection layers 65a–65d; and first contacts 64a–64d connecting the active layers and the third metal interconnection layers.

Here, third metal interconnection layer 65a is a GND interconnection, and third metal interconnection layer 65b is a Vcc interconnection. First contacts 64a and 64b are especially called the GND contacts, and first contacts 64c and 64d are especially called the Vcc contacts. The pattern further includes a first contact 64e connecting the polysilicon layer and the third metal interconnection layer, and second contacts 66a, 66b connecting first-layer bit lines 32a, 32b and active layers 62a, 62b, respectively. Herein, second contacts 66a and 66b are especially called the bit line contacts.

Active layers 62b, 62e, 62g and 62i form storage node portions in which memory data of the memory cells are stored. Active layers 62b and 62g form one storage node portion connected by third metal interconnection layer 65c, and active layers 62e and 62i form the other storage node portion connected by third metal interconnection layer 65d.

Figure 11:
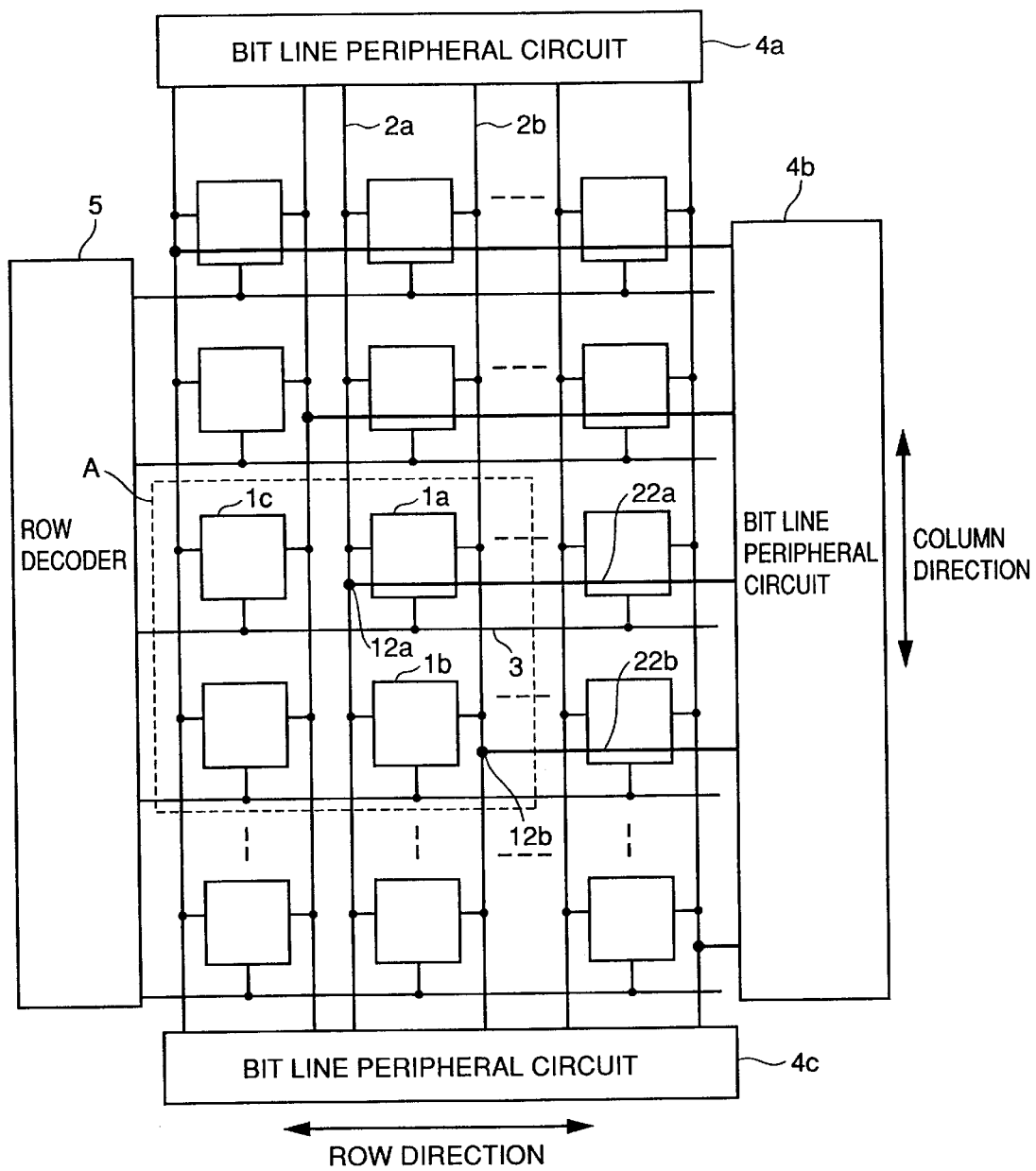
FIG. 11 shows configurations of a conventional memory cell array and its peripheral circuits.
Figure 12:
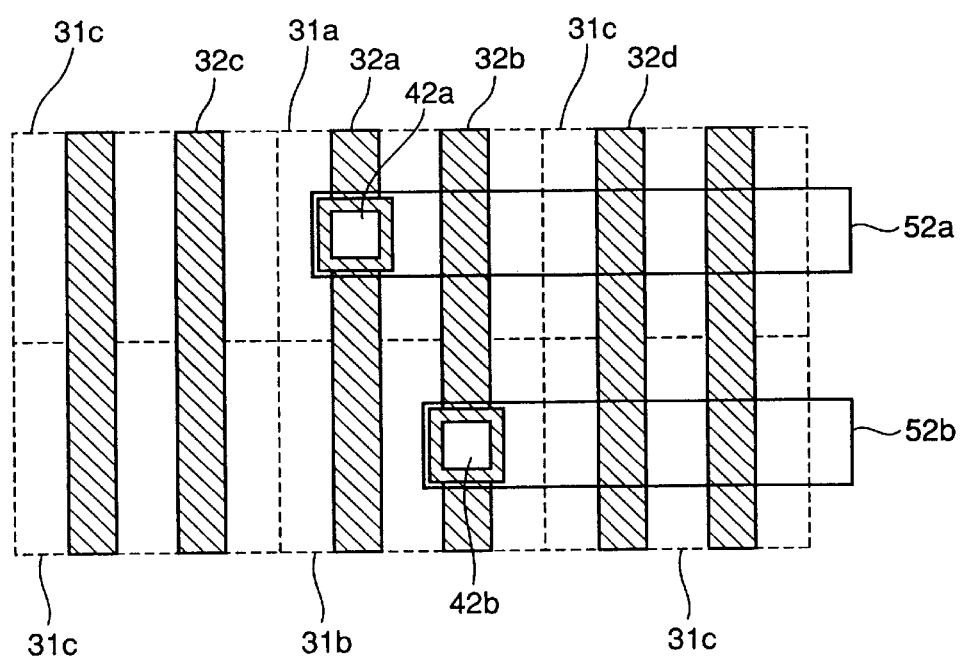
FIG. 12 shows a first pattern of the conventional memory cell array.

Further, active layers 62c, 62f are called the GND active layers, because they are connected via GND contacts 64a, 64b to GND interconnection 65a. Active layers 62g, 62i are called the Vcc active layers, because they are connected via Vcc contacts 64c, 64d to Vcc interconnection 65b. Polysilicon layer 63a corresponds to word line 3 of FIG. 11.

The configuration of the present embodiment shown in FIG. 2 differs from the conventional one shown in FIG. 13 in that separating insulation film 61b between active layers 62b and 62e or between 62g and 62i for storing memory data, located at about the center of the memory cell, or, the insulation film separating the two storage node portions, is increased in the width from d1 to d2.

Thus, the memory cell pattern underneath the first-layer bit lines can readily be enlarged by widening the separating insulation film 61b, corresponding to the increase of the size in the row direction of the memory cell regions having through-holes therein. This increase in the width of separating insulation film 61b is considered to have no specific effects on the operation of the memory cell.

As another modification of the memory cell-pattern underneath the first-layer bit lines, GND active layers 62c, 62f and/or Vcc active layers 62h, 62j can be widened in the row direction without difficulty. This corresponds to the increase of sizes d3–d6 in FIG. 2.

In the conventional art, all the memory cells on a memory cell array were supposed to have identical size and pattern. This applied in particular to the layer underneath the first-layer bit lines.

This is due to the concern that memory cells having different patterns may differ in optimal conditions for photolithography, and may result in different electrical properties.

In FIG. 2, however, what is essentially needed is to change the width of separating insulation film 61b or the widths of GND and/or Vcc active layers 62c, 62f, 62h, 62j. This is considered to prevent significant variations in the conditions for photolithography or in the electrical properties.

Third Embodiment

Figure 3:
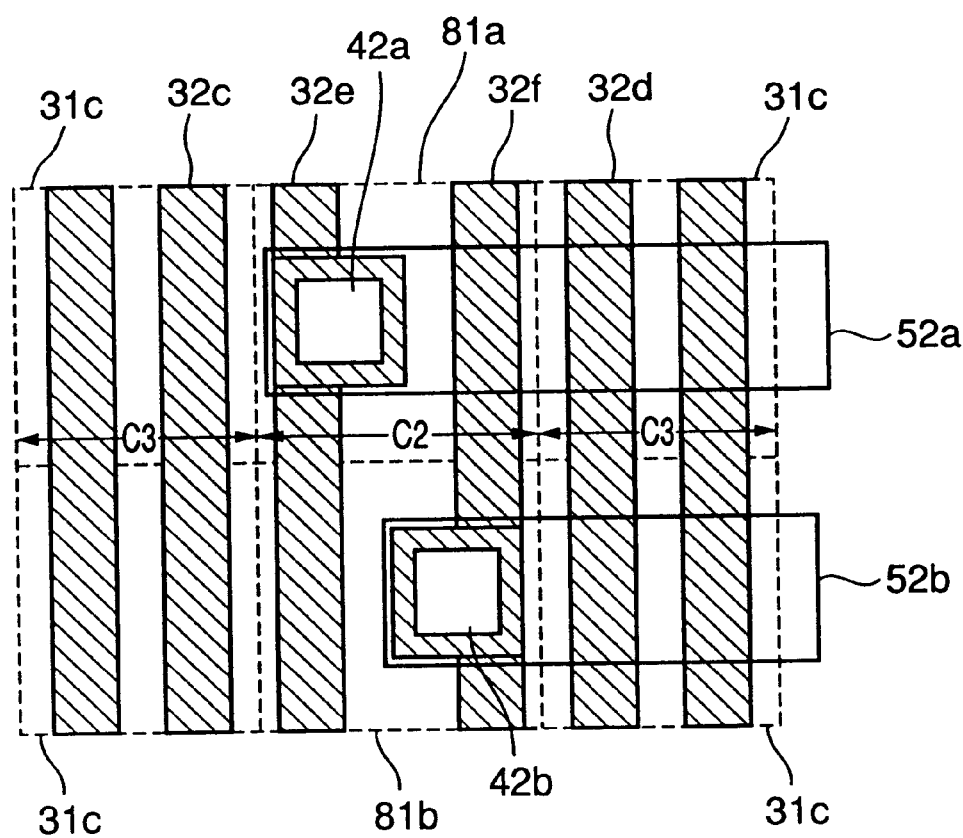
FIGS. 3 to 5 show patterns of memory cell arrays according to third to fifth embodiments of the present invention.

In FIG. 1, the pattern of the first-layer bit lines has a portion projecting from both sides beyond the bit line width, around the area in which a through-hole is being created. FIG. 3 shows, as the third embodiment, the case where such projection is allowed only to one side.

With reference to FIG. 3, memory cell regions 81a and 81b, and first-layer bit lines 32e and 32f are shown.

Memory cell region 81a of FIG. 3 has boundaries in the row direction as follows. The boundary on the left side is a line passing the midpoint between the edges of first-layer bit lines 32e and 32c, and parallel to firstlayer bit line 32c. The boundary on the right side is a line passing the midpoint between the edges of first-layer bit lines 32f and 32d, and parallel to first-layer bit line 32d.

The conventional memory cell regions all had an identical size C2 in the row direction. In the present embodiment, however, they have different sizes in the row direction: C2 for the memory cell regions having through-holes therein; and C3 for those having no through-holes.

Specifically, the size in the row direction of the memory cell region in the case of FIG. 3 can be expressed as follows:

$$2S+2W \leq C3 < 2S+2M+X+W \leq C2$$

Figure 15:
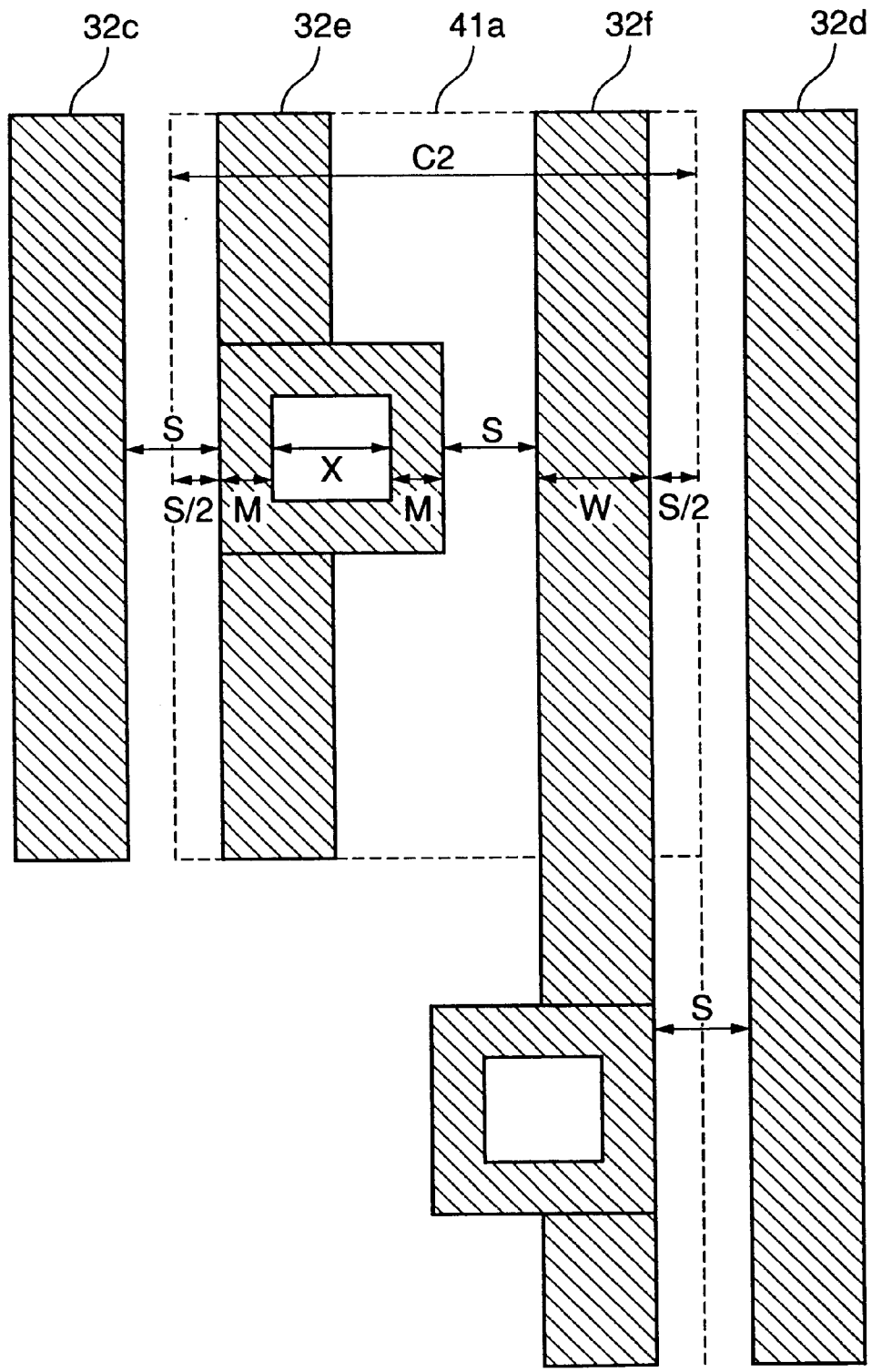

In this case, as explained in conjunction with FIGS. 14 and 15, the size C2 in the row direction of the memory cell region shown in FIG. 3 can be decreased by M with respect to the size C1 of the memory cell region shown in FIG. 1.

Fourth Embodiment

Figure 4:
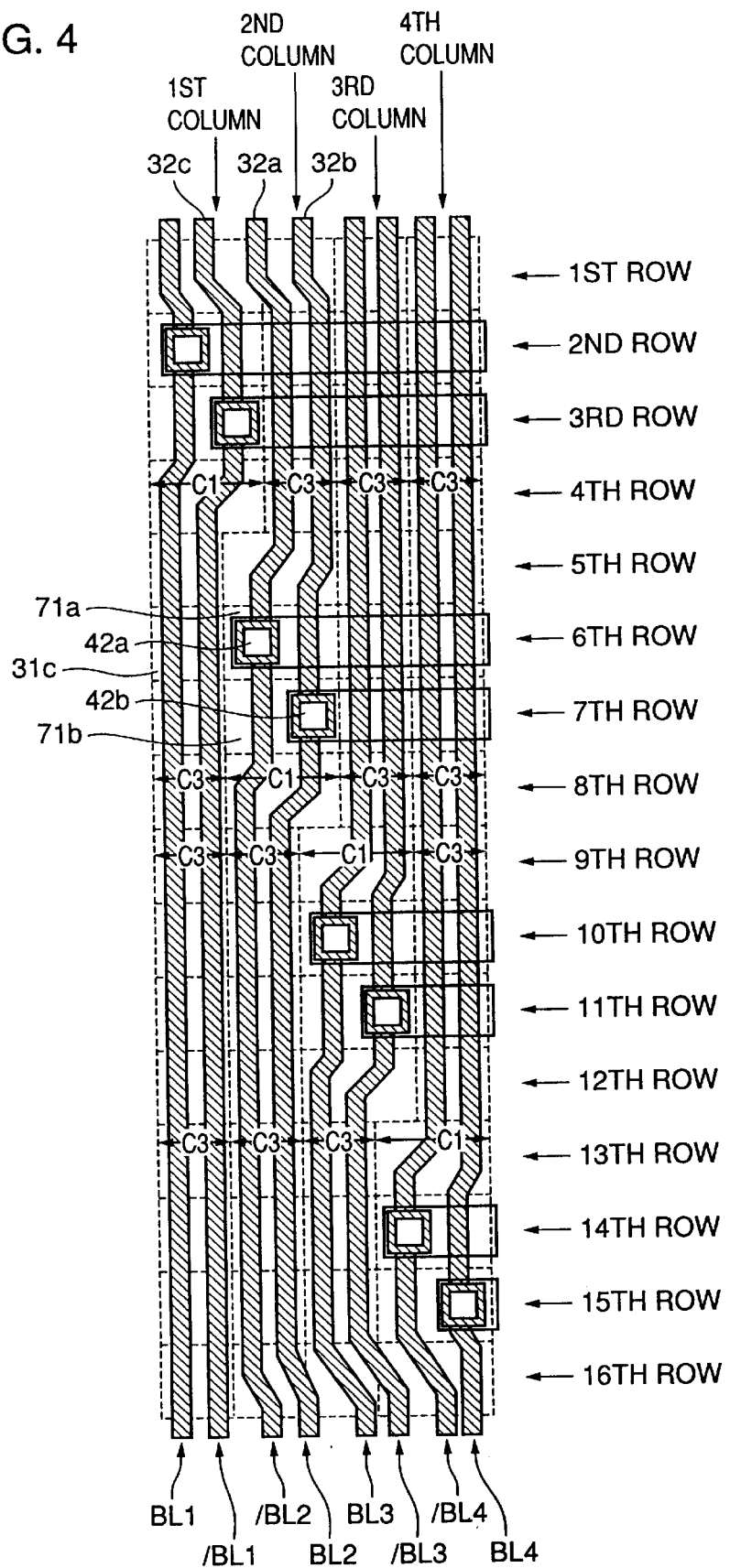

FIG. 4 shows, as the fourth embodiment, the memory cell array having a larger number of memory cells than in the first embodiment. Specifically, in FIG. 4, memory cells in 16 rows and 4 columns are selected, which are shown associated with the bit lines in the first and second layers.

The memory cells shown in FIG. 1 of the first embodiment correspond, for example, to those in the first through third columns and the sixth and seventh rows of FIG. 4.

The first-layer bit lines should be continuously connected in the column direction over the memory cell regions with and without throughholes.

However, the first-layer bit lines should be diagonally disposed over the portions where the sizes of the memory cell regions change from C1 to C3. In such places, the design criteria regarding the size of the first-layer bit lines may be unfulfilled, for example, due to the projections in first-layer bit lines 32a, 32b as shown in FIG. 1.

To address the problem, in the present embodiment, the size in the row direction of the memory cell region having no through-hole that is placed adjacent to the memory cell region having the through-hole is increased. Specifically, as shown in FIG. 4, the memory cell region located at the second column, fifth row, that is adjacent in the column direction to memory cell region 71a having through-hole 42a, and the memory cell region located at the second column, eighth row, that is adjacent in the column direction to memory cell region 71b having through-hole 42b, are made to have the increased size C1 in the row direction. Thus, it becomes possible to continuously dispose the first-layer bit lines within its design criteria.

From the pattern shown in FIG. 4, the following structures are conceivable.

The structure characterized in that memory cell regions 71a, 71b having through-holes 42a, 42b are prevented from being placed adjacent to the memory cell regions having shorter lengths in the row direction with no through-holes therein.

The structure characterized in that memory cell regions 71a, 71b having through-holes 42a, 42b are prevented from being placed, only in the row direction, adjacent to the memory cell regions having shorter lengths in the row direction with no through-holes therein.

The structure characterized in that memory cell regions 71a, 71b having through-holes 42a, 42b are prevented from being placed, only in the column direction, adjacent to the memory cell regions having shorter lengths in the row direction with no through-holes therein.

The structure characterized in that only memory cell regions 71a, 71b having through-holes 42a, 42b are longer in the row direction.

The structure characterized in that the lengths in the row direction of the memory cell regions having no through-holes that are placed adjacent in the column direction to memory cell regions 71a, 71b having through-holes 42a, 42b are the same as the lengths in the row direction of the memory cell regions 71a, 71b.

In the present embodiment, the size in the row direction of the memory cell region without a through-hole is increased only in a single row immediately adjacent to the memory cell region with the through-hole. However, it is also possible to increase the size in the row direction of the memory cell regions without through-holes over a plurality of rows with respect to the memory cell region with the through-hole. In this case, the inclination of the interconnections becomes more moderate, which simplifies the patterning.

Fifth Embodiment

Figure 5:
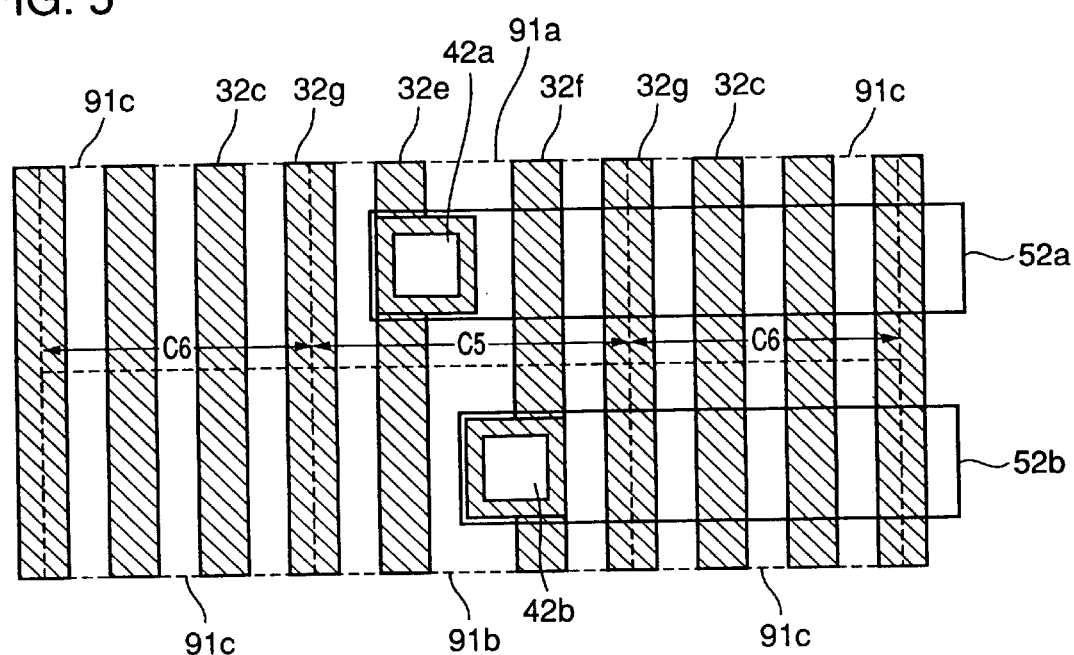

FIG. 5 shows a memory cell array of the fifth embodiment of the present invention. The present embodiment differs from the first and second embodiments in that essentially three lines, instead of the two lines, of the first metal interconnection layer pass through the memory cell regions.

With reference to FIG. 5, memory cell regions 91a–91c; first-layer bit lines 32e, 32f formed of the first metal interconnection layer; and GND interconnections 32g formed of the first metal interconnection layer are shown.

Memory cell regions 91a and 91b having through-holes therein have the size C5 in the row direction, which is greater than the size C6 of the memory cell regions having no through-holes.

Memory cell region 91a has boundaries on its both sides each located on the center line of GND lines 32g. This means that each half of GND lines 32g, or an equivalent to one GND line 32g, is included in the memory cell region. Thus, it can be said that, together with first-layer bit lines 32e and 32f, in all 3 lines of the first metal interconnection layer pass through the memory cell region.

Figure 6:
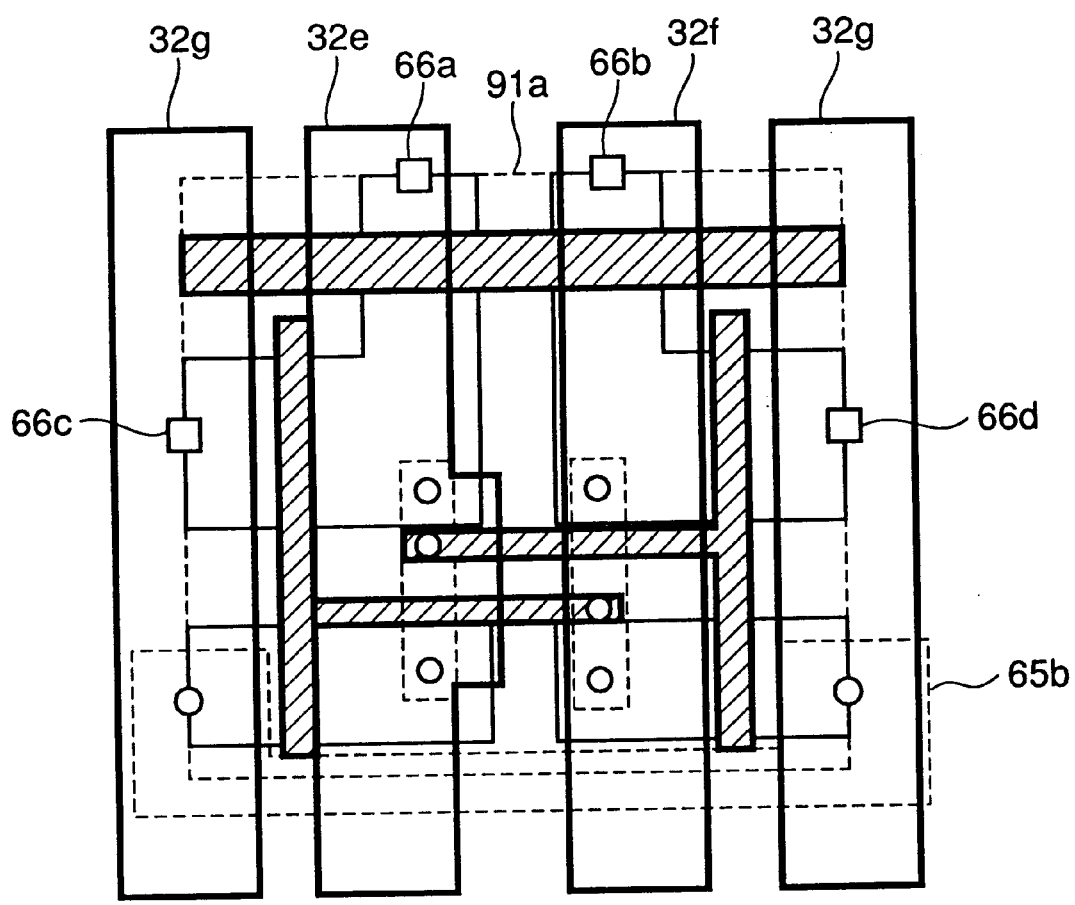
FIG. 6 shows a pattern of a memory cell region according to the fifth embodiment.

FIG. 6 shows a memory cell pattern underneath the first-layer bit lines in memory cell region 91a of FIG. 5. Second contacts 66c and 66d connecting GND interconnections 32g and the active layers are shown.

In the second embodiment as shown in FIG. 2, the GND interconnection was formed of third metal interconnection layer 65a. In the present embodiment, it is formed of first metal interconnection layer 32g. Therefore, even when more than two lines of the first metal interconnection layer pass through the memory cell regions, it is possible to restrict the increase in area of the memory cell array by decreasing the size in the row direction of the memory cell regions without through-holes therein, as in the first and second embodiments.

In the present embodiment, GND interconnection 65a in FIG. 2 is replaced by the ones formed of the first metal interconnection layer. The same effects can be obtained if Vcc interconnection layer 65b of FIG. 2 is formed of the first metal interconnection layer.

Sixth Embodiment

Figure 7:
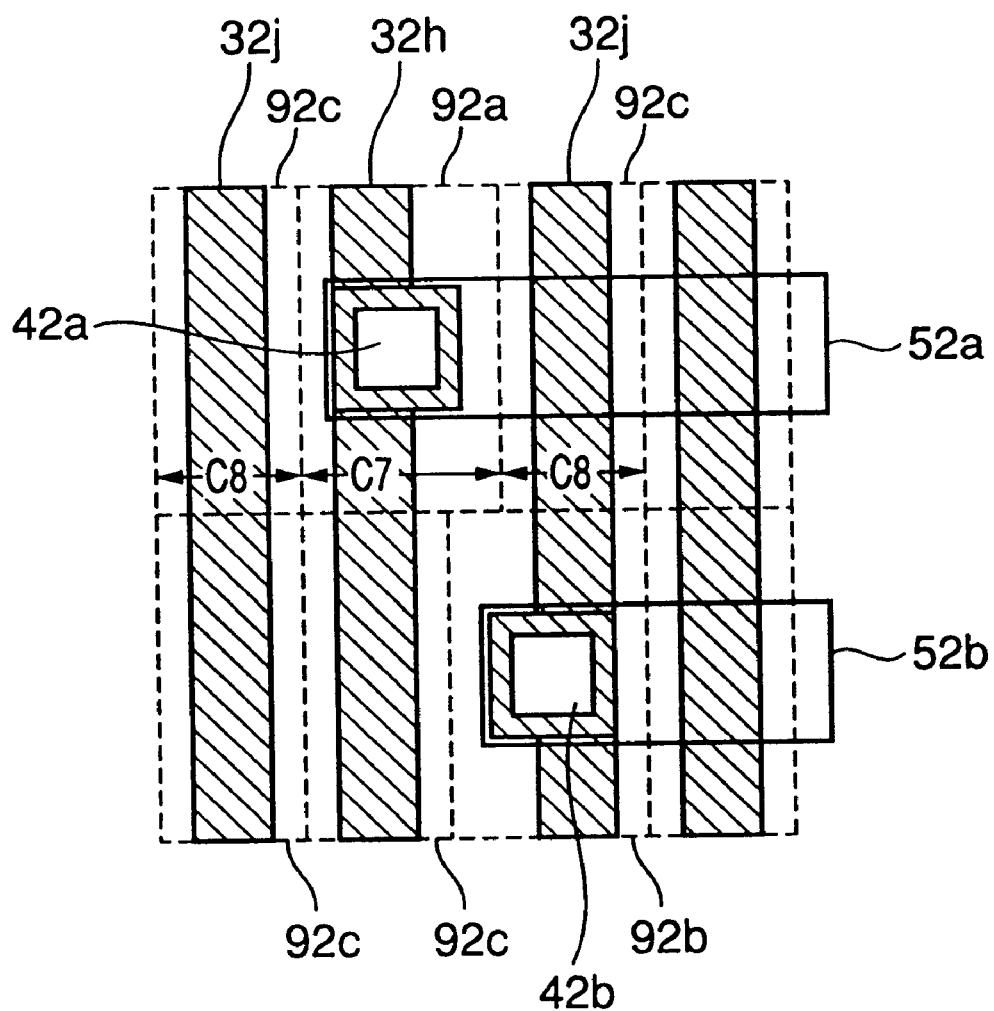
FIGS. 7 to 10 show patterns of memory cell arrays according to sixth through ninth embodiments of the present invention.

FIG. 7 shows a memory cell array according to the sixth embodiment of the present invention. The first embodiment was directed to a memory having two bit lines per memory cell, like an SRAM. The present embodiment is directed to a memory having one bit line per memory cell, such as a dynamic random access memory (DRAM), a flash clear electrically erasable programmable read only memory (FlashFEPROM), and a ferroelectric random access memory (FRAM).

With reference to FIG. 7, memory cell regions 92a–92c, and first-layer bit lines 32h–32j formed of the first metal interconnection layer are shown.

Memory cell regions 92a and 92b having through-holes therein have the size C7 in the row direction, which is greater than the size C8 in the row direction of the memory cell regions having no through-holes.

Thus, even in the case of memory cell regions each having one line of first metal interconnection layer passing therethrough, the increase in area of the memory cell array can be restricted by decreasing the size in the row direction of the memory cell regions without through-holes therein, as in the first embodiment.

Seventh Embodiment

Figure 8:
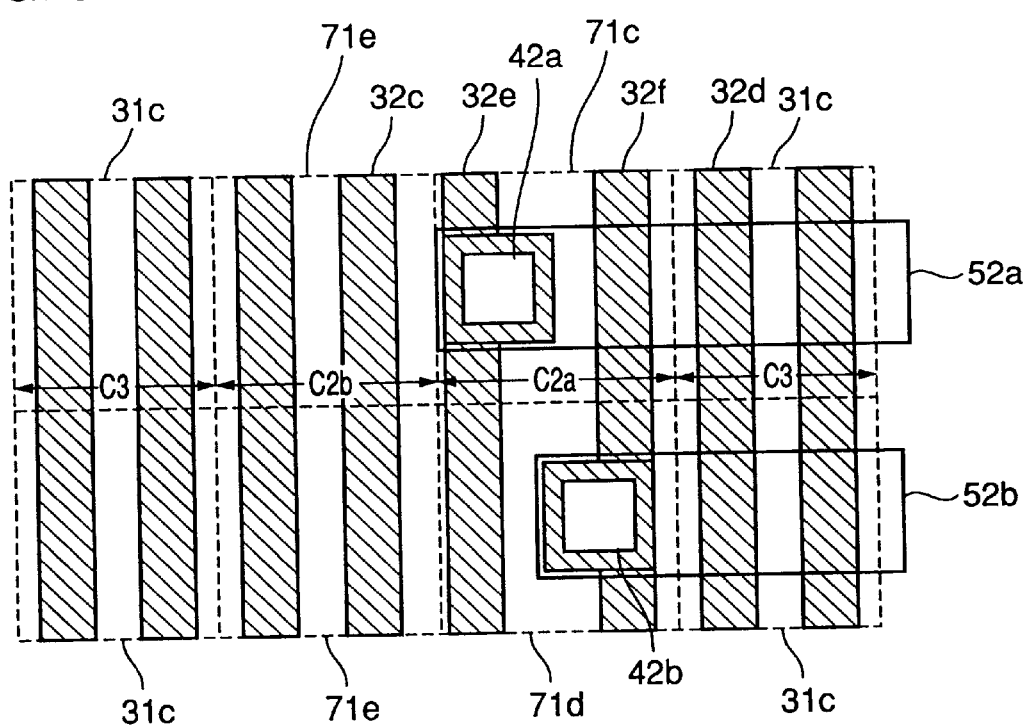

FIG. 8 shows a memory cell array according to the seventh embodiment of the present invention. In the first embodiment, only the memory cell region having a through-hole therein was elongated in its row direction. In the present embodiment, not only the memory cell region having a through-hole but also the memory cell region adjacent thereto in the row direction is elongated in the row direction.

With reference to FIG. 8, memory cell regions 71c–71e are shown. Of these memory cell regions, memory cell regions 71c and 71d have the size C2a in the row direction, and memory cell regions 71e have the size C2b in the row direction. C2a and C2b are both greater than the size C3 in the row direction of memory cell regions 31c.

Thus, the size of the memory cell regions in the row direction is increased not only in the memory cell region having a through-hole, but also in the memory cell region adjacent thereto in the row direction. Since this prevents only one region from being widened, a relatively uniform pattern arrangement can be attained on the memory cell array. This leads to more stable conditions for photolithography.

In the present embodiment, only the memory cell region immediately on the left side of the one having the through-hole is widened in the row direction. However, it is also possible to widen the memory cell regions immediately on both sides of the one having the through-hole, or even the memory cell regions over a plurality of columns adjacent to the one having the through-hole may be widened in the row direction.

Eighth Embodiment

Figure 9:
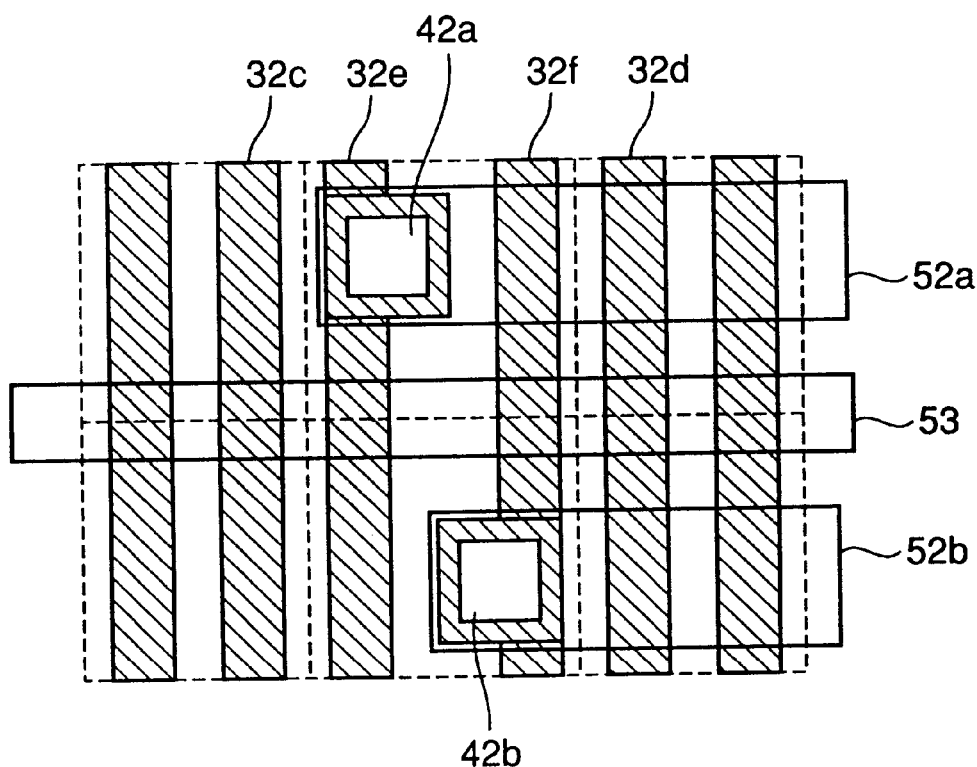

FIG. 9 shows a memory cell array according to the eighth embodiment of the present invention. In the first embodiment, second-layer bit lines 52a and 52b are adjacent to each other, as shown in FIG. 1. In the present embodiment, between the second-layer bit lines, another line of the second metal interconnection layer is placed, which is formed in the same step as the second-layer bit lines.

With reference to FIG. 9, the second metal interconnection layer 53 is newly provided, disposed between second-layer bit lines 52a and 52b.

This can prevent noise between the second-layer bit lines. In particular, it is preferable that second metal interconnection layer 53 is held at a constant potential when the semiconductor device is in operation, e.g., in the accessing operation. Specifically, it is preferred to be a Vcc interconnection or a GND interconnection.

Further, second metal interconnection layer 53 may be connected to GND interconnection 32g of the fourth embodiment shown in FIG. 5.

Ninth Embodiment

Figure 10:
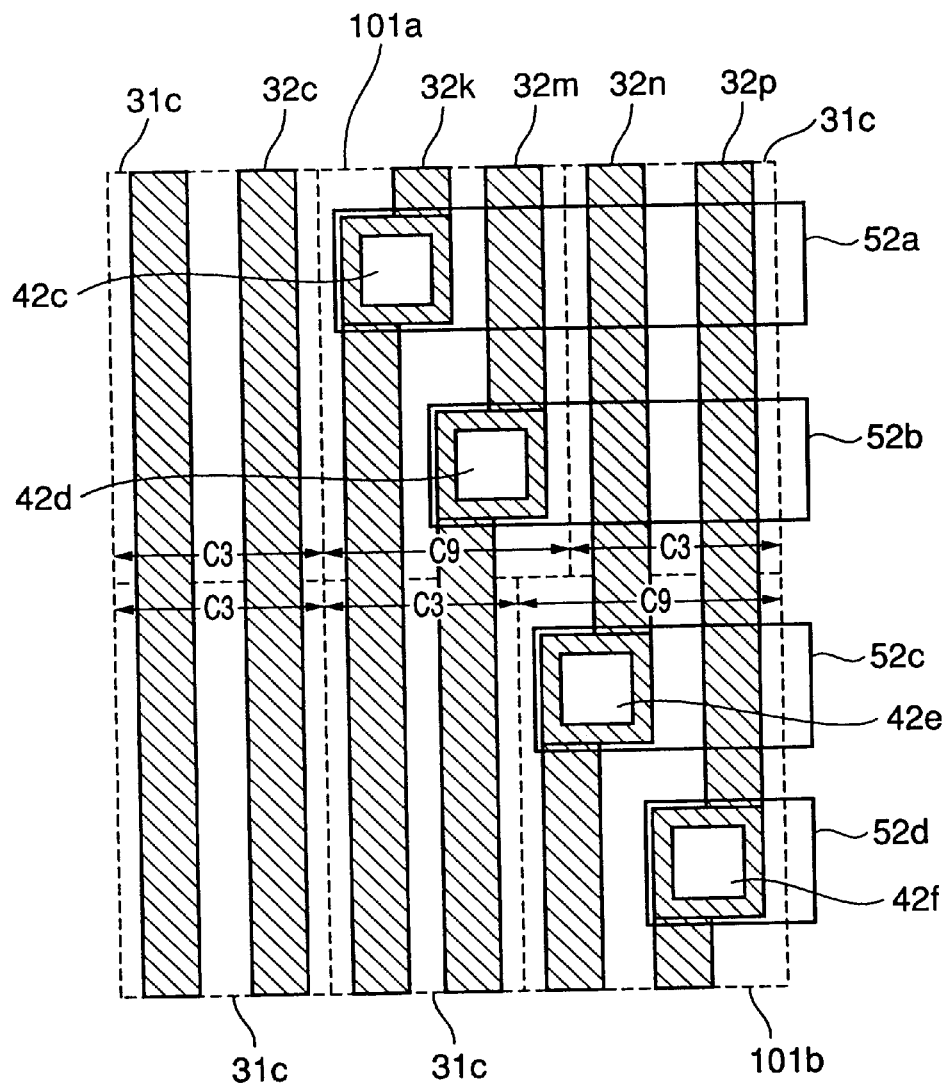

FIG. 10 shows a memory cell array according to the ninth embodiment of the present invention. In the first embodiment, one through-hole is disposed in one memory cell region, as shown in FIG. 1. In the present embodiment, a plurality of through-holes is disposed in one memory cell region.

With reference to FIG. 10, memory cell regions 101a and 101b are shown. Also shown are first-layer bit lines 32k, 32m, 32n, 32p formed of the first metal interconnection layer, and second-layer bit lines 52a–52d formed of the second metal interconnection layer, connected to the first-layer bit lines via through-holes 42c–42f, respectively. Memory cell regions 101a and 101b each have two through-holes, and have the size C9 in the row direction, which is greater than the size C3 in the row direction of the memory cell regions having no through-holes. Disposing two through-holes in one memory cell region can decrease the number of memory cells having through-holes, and hence, having the size greater in the row direction, as compared to the case where only one through-hole is disposed in one memory cell region. Thus, it is possible to restrict the increase in area of the memory cell array.

Tenth Embodiment

In the first through ninth embodiments, the second-layer bit lines are formed on the first-layer bit lines. Alternatively, it is possible to form the first-layer bit lines on the second-layer bit lines.

This is suitable for the case in which the interconnection length of first-layer bit lines 32a, 32b of FIG. 1, for example, is greater than that of second-layer bit lines 52a, 52b. This is due to the fact that the metal interconnection layers are normally thicker in the upper layer than in the lower layer, and thus, interconnection resistance is lower in the upper layer, where the delay due to the lengthy interconnection can be suppressed.

The various embodiments have been described above. Each embodiment shows, by way of example, the bit lines formed of the first and second metal interconnection layers. However, they are not limited thereto. The bit lines may also be formed of polysilicon interconnection layers, silicide interconnection layers, or the like.

Further, the embodiments show, by way of example, the first-layer bit lines perpendicularly traversing the second-layer bit lines. However, they may be disposed in parallel with each other, or even diagonally to each other.

Moreover, the memory cell regions are widened in the row direction, in a row adjacent to the one having a through-hole as in the fourth embodiment, and in a column adjacent to the one having a through-hole as in the seventh embodiment. However, the memory cell regions adjacent in both the row and column directions may be widened in the row direction.

The embodiments described above include memory cell regions having through-holes, 71a and 71b of FIG. 1, for example, which are disposed adjacent to each other. In such a case, however, the second-layer bit lines being connected via through-holes are also placed adjacent to each other, except for the eighth embodiment, thereby causing a problem with noise or the like. Thus, it is also possible to prevent the memory cell regions having through-holes from being placed adjacent to each other.

To this effect, however, a memory cell region with no through-hole is to be disposed between the ones having through-holes. In such a case, the size of the memory cell region with no through-hole placed between the ones having through-holes may be increased in the row direction within a range unaffecting the area of the memory cell array.

Moreover, in the above embodiments, the size of the memory cell regions in the column direction is defined as the minimal distance between the center of the bit line contact and the center line of the Vcc interconnection. However, the memory cell regions may have different configurations dependent on the types of the memory cells.

Thus, another definition is possible for the size of the memory cell region in the column direction. Generally, two memory cells adjacent in the column direction share a bit line contact. Therefore, of the first through fourth memory cell regions continuous in the column direction, a half of the minimal distance in the column direction between the center of the bit line contact shared by the first and second memory cell regions and the center of the bit line contact shared by the third and fourth memory cell regions may be regarded as the size of the memory cell region in the column direction.

In this case, one boundary of the memory cell regions in the column direction is a line passing the center of the bit line contact and extending parallel to the row direction of the memory cell array, and the other boundary is a line passing the midpoint between the centers of the bit line contacts and extending parallel to the row direction of the memory cell array.

The definition as above is by way of example, and any other definition is possible as long as it corresponds to a memory cell unit in the column direction in which data of one bit is stored.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array having a plurality of memory cells arranged in a matrix of a row direction and a column direction;
   a first-layer bit line passing a memory cell region having said memory cell formed therein and extending in the column direction of said memory cell array; and
   a second-layer bit line connected via a contact hole to said first-layer bit line;
   said memory cell array including a first memory cell region having said contact hole disposed therein and a second memory cell region without said contact hole therein, and the second memory cell region without said contact hole having a length in the row direction that is shorter than a length in the row direction of the first memory cell region with said contact hole.

2. The semiconductor memory device according to claim 1, wherein
   the first memory cell region with said contact hole is prevented from being placed adjacent to the second memory cell region without said contact hole having the shorter length in the row direction.

3. The semiconductor memory device according to claim 2, wherein
   the first memory cell region with said contact hole is prevented from being placed, only in the row direction, adjacent to the second memory cell region without said contact hole having the shorter length in the row direction.

4. The semiconductor memory device according to claim 2, wherein
   the first memory cell region with said contact hole is prevented from being placed, only in the column direction, adjacent to the second memory cell region without said contact hole having the shorter length in the row direction.

5. The semiconductor memory device according to claim 1, wherein
   only the first memory cell region with said contact hole has a longer length in the row direction.

6. The semiconductor memory device according to claim 1, wherein
   the second memory cell region without said contact hole that is placed adjacent in the column direction to said first memory cell region with said contact hole has the same length in the row direction as the first memory cell region.

7. The semiconductor memory device according to claim 1, wherein
   said memory cell region has first and second storage node portions,
   a first active layer is formed in said first storage node portion and a second active layer is formed in said second storage node portion,
   said first active layer and said second active layer are spaced apart from each other by a separating insulation film, and
   said separating insulation film in the second memory cell region without said contact hole is narrower than said separating insulation film in the first memory cell region with said contact hole.

8. The semiconductor memory device according to claim 1, wherein
   said memory cell region includes
   a GND interconnection or a Vcc interconnection and
   an active layer connected to said GND interconnection or an active layer connected to said Vcc interconnection,
   said active layer in the second memory cell region without said contact hole being narrower in the row direction than said active layer in the first memory cell region with said contact hole.

9. The semiconductor memory device according to claim 1, wherein
   said second-layer bit line includes first and second bit lines, and an interconnection layer is disposed between said first and second bit lines that is formed in the same step as said first and second bit lines.

10. The semiconductor memory device according to claim 1, wherein
    said second-layer bit line includes first and second bit lines,
    said first-layer bit line includes third and fourth bit lines,
    said first bit line and said third bit line are connected to each other via a first contact hole, and said second bit line and said fourth bit line are connected to each other via a second contact hole, and
    said first and second contact holes are disposed in one memory cell region.

11. The semiconductor memory device according to claim 1, wherein
    said first-layer bit line is provided in an upper layer than said second-layer bit line.

12. The semiconductor memory device according to claim 1, wherein
    the memory cell regions with said contact holes are prevented from being placed adjacent to each other.

* * * * *